United States Patent
Spangler et al.

(10) Patent No.: US 9,404,177 B2
(45) Date of Patent: Aug. 2, 2016

(54) OBSTRUCTING MEMBER FOR A FLUIDIZED BED REACTOR

(71) Applicant: REC Silicon Inc, Moses Lake, WA (US)

(72) Inventors: Michael V. Spangler, Soap Lake, WA (US); Matthew J. Miller, Moses Lake, WA (US)

(73) Assignee: REC Silicon Inc, Moses Lake, WA (US)

( * ) Notice: Subject to any disclaimer, the term of this patent is extended or adjusted under 35 U.S.C. 154(b) by 78 days.

(21) Appl. No.: 14/462,048

(22) Filed: Aug. 18, 2014

(65) Prior Publication Data

US 2016/0047043 A1 Feb. 18, 2016

(51) Int. Cl.
*C23C 16/44* (2006.01)
*C23C 16/24* (2006.01)
*C23C 16/442* (2006.01)

(52) U.S. Cl.
CPC ............ *C23C 16/24* (2013.01); *C23C 16/442* (2013.01); *C23C 16/4417* (2013.01)

(58) Field of Classification Search
None
See application file for complete search history.

(56) References Cited

U.S. PATENT DOCUMENTS

| | | | |
|---|---|---|---|
| 4,115,927 A | 9/1978 | Rosensweig | |
| 4,176,710 A | 12/1979 | Gansauge et al. | |
| 4,213,937 A | 7/1980 | Padovani et al. | |
| 4,231,991 A * | 11/1980 | Muller | B29B 9/16 422/245.1 |
| 4,423,274 A | 12/1983 | Daviduk et al. | |
| 4,778,661 A | 10/1988 | Avidan et al. | |
| 4,899,014 A | 2/1990 | Avidan et al. | |
| 4,904,452 A | 2/1990 | Acharya et al. | |
| 5,798,137 A | 8/1998 | Lord et al. | |
| 6,451,277 B1 | 9/2002 | Lord | |
| 6,461,672 B1 * | 10/2002 | Kosola | B01J 2/006 118/303 |
| 6,827,786 B2 | 12/2004 | Lord | |
| 7,001,579 B2 | 2/2006 | Metzger et al. | |
| 7,641,872 B2 | 1/2010 | Inaba | |
| 7,922,990 B2 | 4/2011 | Hertlein et al. | |
| 8,075,692 B2 | 12/2011 | Osborne et al. | |
| 2004/0151652 A1 | 8/2004 | Herold et al. | |
| 2008/0000622 A1 | 1/2008 | Hugues et al. | |
| 2010/0074823 A1 | 3/2010 | Inaba | |
| 2010/0183496 A1 | 7/2010 | Narukawa | |

(Continued)

FOREIGN PATENT DOCUMENTS

| | | |
|---|---|---|
| EP | 0 776 692 A1 | 6/1997 |
| EP | 2 055 674 A1 | 5/2009 |
| WO | WO 88/04199 A1 | 6/1988 |

(Continued)

OTHER PUBLICATIONS

International Search Report and Written Opinion, dated May 29, 2015, issued in corresponding International Application No. PCT/US2014/070627.

(Continued)

*Primary Examiner* — Joseph Miller, Jr.
(74) *Attorney, Agent, or Firm* — Klarquist Sparkman, LLP

(57) ABSTRACT

Embodiments of an obstructing member and methods for its use in a fluidized bed reactor are disclosed. The obstructing member comprises a plurality of receiving members, each receiving member comprising a tubular wall defining a passageway dimensioned to receive an internal reactor component, and a plurality of connecting elements connecting the receiving members, wherein the obstructing member occupies from 15-60% of a horizontal cross-section of a reaction chamber of the fluidized bed reactor.

18 Claims, 3 Drawing Sheets

(56) References Cited

U.S. PATENT DOCUMENTS

2010/0226844 A1 9/2010 Spangler et al.
2011/0129402 A1 6/2011 Chee

FOREIGN PATENT DOCUMENTS

| WO | WO 2004/013044 | 2/2004 |
| WO | WO 2014/035878 | 3/2014 |
| WO | WO 2014-074510 | 5/2014 |

OTHER PUBLICATIONS

International Search Report and Written Opinion, issued by the European Patent Office on Apr. 22, 2010, for corresponding PCT Patent Application No. PCT/US2010/020656, filed Jan. 11, 2010, 10 pages.
Krishnamurty et al., "Gas-Solids Fluidization in Baffled Beds," *J. of the Insitution of Engineers* (*India*), Feb. 1981, 61:38-40, 43.

\* cited by examiner

OBSTRUCTING MEMBER FOR A FLUIDIZED BED REACTOR

FIELD

This invention concerns an obstructing member for a fluidized bed reactor and methods for its use.

BACKGROUND

Pyrolytic decomposition of silicon-bearing gas in fluidized beds is an attractive process for producing polysilicon-coated granular material, such as polysilicon or polysilicon-coated germanium, due to excellent mass and heat transfer, increased surface for deposition, and continuous production. An issue in many fluidized bed reactors is the formation of large bubbles within the bed in the main reaction zone under certain conditions.

An unwanted effect of large bubbles, particularly in gas-solid systems, is that they can cause the bed to bounce violently up and down as they lift a significant fraction of the bed, then drop it suddenly. This pressure oscillation can interfere with proper operation of the bed by causing the gas velocity rate to vary, which may be harmful to optimum productivity. The pressure oscillation also causes mechanical stress to the reactor structure and any directly connected support equipment. Furthermore, large bubbles can cause the bed material to surge upward in the reactor in a phenomenon known as "slugging." Slugging can cause ejection of at least a portion of the bed from the reactor or damage internal reactor components.

SUMMARY

Embodiments of an obstructing member for use in a fluidized bed reactor comprise a plurality of receiving members, each receiving member comprising a tubular wall defining a passageway dimensioned to receive an internal reactor component located in a freeboard region of the fluidized bed reactor; and a plurality of connecting elements connecting the receiving members, wherein the perimeter of the obstructing member defined by the connecting elements and receiving members, as viewed vertically from the top, defines an area that is sized and shaped to occupy from 15-60% of a horizontal cross-sectional area of a freeboard region of a reaction chamber that contains the obstructing member. The obstructing member is (i) constructed of a high-temperature stainless steel, a martensitic stainless steel, a nickel-iron-chromium alloy, an iron-chromium-nickel-molybdenum alloy, or a cobalt-based superalloy, or a combination thereof, (ii) constructed of a non-contaminating material, or (iii) exposed outer surfaces of the obstructing member are coated with a protective layer of a non-contaminating material. In some embodiments, the non-contaminating material comprises a cobalt-chromium alloy, tungsten carbide/cobalt, tungsten carbide/nickel boron, silicon carbide, or silicon nitride.

In any or all of the above embodiments, the obstructing member may include four receiving members and four connecting elements connecting the receiving members, wherein the four connecting elements are the bases and legs of a trapezoid with one of the receiving members located at each vertex of the trapezoid. In some embodiments, each receiving member further comprises an outwardly extending support element.

In any or all of the above embodiments, the tubular wall of each receiving member may further comprise a receiving member extension, which extends along a portion of an adjacent connecting element. In some embodiments, each receiving member extension comprises an aperture aligned with a corresponding aperture on the adjacent connecting element.

Embodiments of a reactor for producing silicon-coated granular material by thermal decomposition of a gas containing silicon comprise a vessel defining a chamber to contain a fluidized bed of particles and a freeboard region above the fluidized bed; a plurality of particles within the chamber, wherein the particles are seed particles, silicon-coated seed particles, or a combination thereof; an inlet positioned for delivering a silicon-bearing gas into the chamber to flow upwardly through the particles; an inlet positioned for delivering a fluidizing gas into the chamber to flow upwardly through the particles to form a fluidized bed of particles; an outlet for venting exhaust gas from the chamber; a top head; one or more internal reactor components extending downwardly from the top head and into the chamber, the internal reactor components comprising a seed nozzle, a thermocouple, a pressure tap, a particle sampling line, a gas sampling line, a gas feed line, a heater, or any combination thereof; and an obstructing member as disclosed herein that is positioned within the freeboard region of the chamber, that is secured to at least one of the one or more internal reactor components, and that is configured to break up a rising slug of particles in the chamber, wherein the perimeter of the obstructing member defined by the connecting elements and receiving members, as viewed vertically from the top, defines an area that occupies from 15-60% of a horizontal cross-sectional area of the region of the chamber that contains the obstructing member. In some embodiments, one of the plurality of connecting element has an outer surface that is coincident with a vertical central axis of the chamber and extends radially from the vertical central axis along a plane that includes the vertical central axis. In any or all of the above embodiments, the one or more internal reactor components may comprise a seed nozzle, and the obstructing member is secured to the seed nozzle.

In any or all of the above embodiments, when each receiving member of the obstructing member includes a receiving member extension comprising an aperture aligned with a corresponding aperture on the adjacent connecting element, a fastener may be received within each receiving member extension aperture and the corresponding aperture on the adjacent connecting element, thereby tightening the receiving member around an internal reactor component.

Embodiments of a method for producing silicon-coated granular material by thermal decomposition of a gas containing silicon include (i) providing a reactor comprising a vessel defining a chamber to contain a fluidized bed of particles and a freeboard region above the fluidized bed, an inlet positioned for delivering a silicon-bearing gas into the chamber to flow upwardly through the chamber, a fluidization inlet positioned for delivering a fluidizing gas into the chamber to flow upwardly through the chamber, an outlet for venting exhaust gas from the chamber, a top head, and one or more internal reactor components extending downwardly from the top head and into the chamber, the internal reactor components comprising a seed nozzle, a thermocouple, a pressure tap, a particle sampling line, a gas sampling line, a gas feed line, a heater, or any combination thereof; (ii) providing a plurality of particles within the chamber; (iii) heating the particles within the chamber to an effective temperature for thermal decomposition of a silicon-bearing gas; (iv) passing a fluidization gas upwardly through the particles in the chamber to provide a fluidized bed of particles; (v) passing the silicon-bearing gas upwardly through the fluidized bed of particles to deposit silicon from the silicon-bearing gas onto the particles;

and (vi) providing an obstructing member as disclosed herein that is positioned within the freeboard region of the chamber, that is secured to at least one of the one or more internal reactor components, and that is configured to break up a rising slug of particles in the chamber. In some embodiments, providing the obstructing member comprises securing the obstructing member to the at least one of the one or more internal reactor components such that one of the plurality of connecting elements has an outer surface that is coincident with a vertical central axis of the chamber and such that the obstructing member is positioned above the fluidized bed of particles during reactor operation.

The foregoing and other objects, features, and advantages of the invention will become more apparent from the following detailed description, which proceeds with reference to the accompanying figures.

DETAILED DESCRIPTION

Embodiments of an apparatus and method for reducing slugging in a reaction chamber of fluidized bed reactor are disclosed. Slugging is the formation of a large gas bubble within the fluidized bed that is capable of lifting at least a portion of the fluidized bed to the top of the reactor. Gas bubbles can become so large that they disrupt fluidization, and can reach a diameter close to the inner diameter of the reaction chamber. As used herein, a "slug" is a rising portion of the fluidized bed that is lifted as the gas bubble rises. Slugging can cause ejection of at least a portion of the bed from the reactor or damage internal reactor components when surging bed material enters the freeboard region, i.e., the upper, free-gas portion of the fluidized bed reactor. Described herein are embodiments of an obstructing member for use in a fluidized bed reactor to reduce or prevent slugging. In contrast to traditional bubble breakers, which extend into the fluidized bed, the disclosed obstructing member is positioned in the freeboard region of the reaction chamber.

Figure 1:
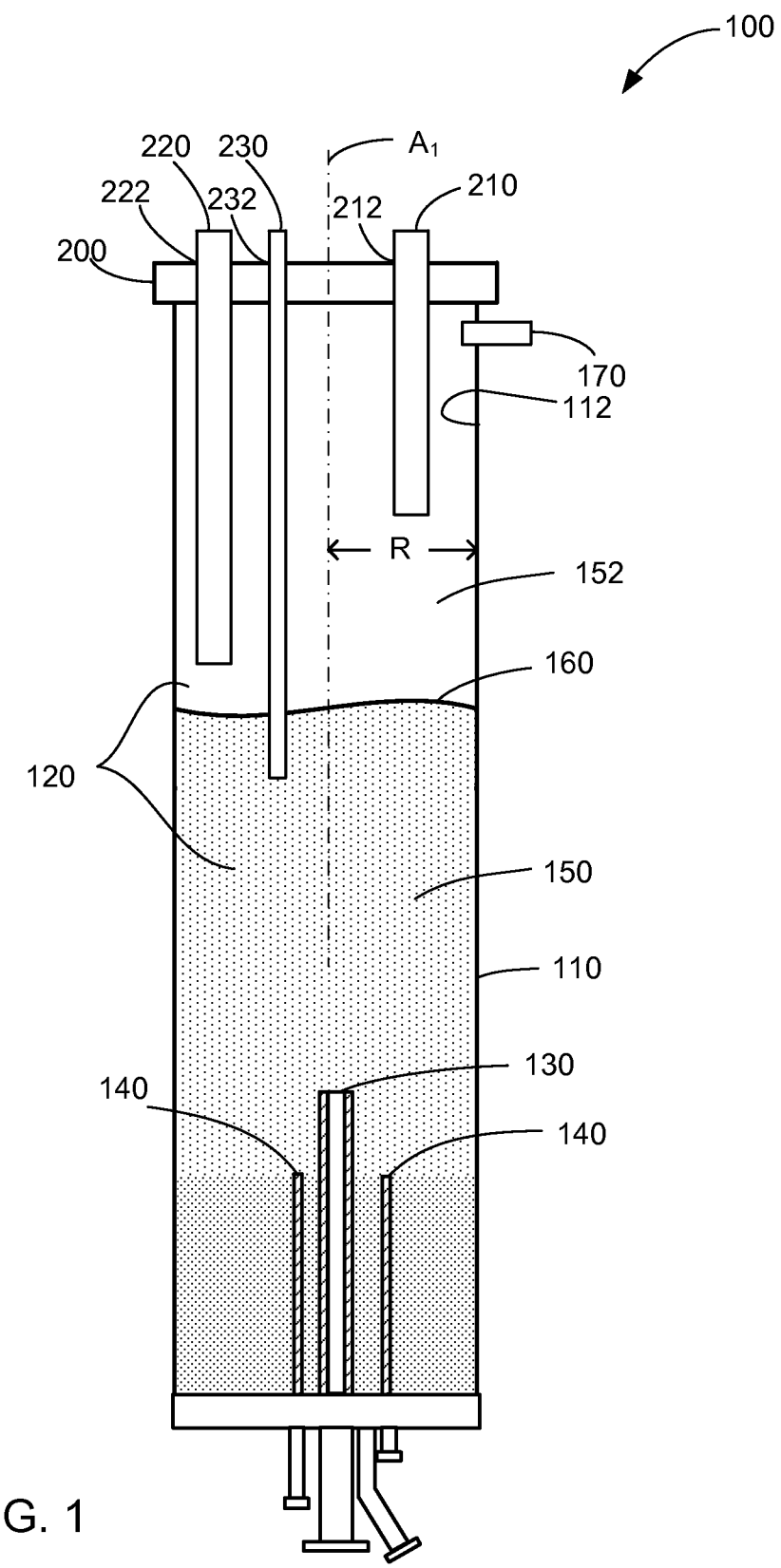
FIG. 1 is a schematic vertical cross-sectional view of one embodiment of a fluidized bed reactor.

FIG. 1 is a schematic diagram of one embodiment of a fluid bed reactor 100 (FBR). The reactor 100 includes an outer wall 110 having an inner surface 112 defining a reaction chamber 120. The reactor 100 further includes an inlet 130 for introducing a reaction gas (e.g., a silicon-bearing or germanium-bearing gas) and one or more fluidization inlets 140. In the exemplary FBR of FIG. 1, the fluidization inlets 140 are elevated nozzles surrounding an inlet nozzle 130. In an independent embodiment, the fluidization inlets may be a fluidization plate. The reaction chamber 120 includes a bed of particles 150, e.g., silicon or germanium particles, and a freeboard region 152 above the particle bed 150. During reactor operation, at least a portion of the bed is fluidized. Boundary 160 represents the average height of the fluidized bed. The reactor 100 further includes an outlet 170 for venting exhaust gas from the chamber. The illustrated reaction chamber 120 is defined by a right circular cylindrical surface having a centerline axis A1. A radius R is measured horizontally from the centerline A1 to the surface 112 at an elevation above the boundary 160.

The FBR 100 further includes a top head 200. A seed nozzle 210 is inserted through an aperture 212 in the top head 200. Seed particles are introduced into the reaction chamber 200 via the nozzle 210. As shown in the exemplary FBR of FIG. 1, the top head assembly 200 may include one or more additional apertures 222, 232 through which additional internal components 220, 230 can be inserted. Internal components that may be inserted through apertures in the top head or otherwise secured to extend downwardly from the top head, include but are not limited to a seed nozzle, a thermocouple, a pressure tap, a particle sampling line, a gas sampling line, a gas feed line, a heater, or any combination thereof. The internal component(s) extend downwardly from the top head and into the chamber.

Figure 2:
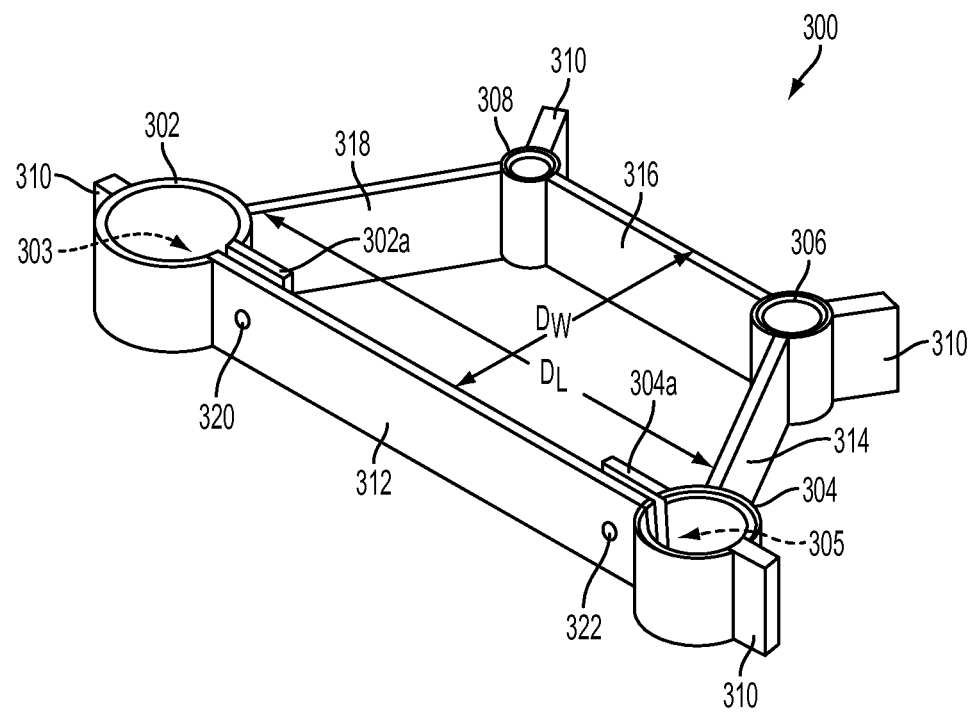
FIG. 2 is a schematic perspective view of an exemplary obstructing member.

FIG. 2 shows an exemplary obstructing member 300. Obstructing member 300 has a shape that includes a width $D_W$ and a length $D_L$, where $D_L$ is orthogonal to $D_W$ and $D_W < D_L$. $D_W$ and $D_L$ are the outside width and outside length, respectively, of obstructing member 300. The obstructing member 300 has a size sufficient to block, or reduce the speed of, a rising portion of the fluidized bed material. The obstructing member 300 includes a plurality of receiving members 302, 304, 306, 308. Each receiving member 302, 304, 306, 308 is a collar that comprises a substantially tubular wall defining a passageway (e.g., passageways 303, 305) dimensioned to receive one or more internal components of the FBR, thereby securing the obstructing member 300 to the one or more internal components and anchoring the obstructing member 300 within the FBR. Receiving members 302, 304, 306, 308 are joined by connecting elements 312, 314, 316, 318.

Each receiving member 302, 304, 306, 308 may include an outwardly extending support element 310. The support elements 310 serve as spacers located between the receiving members and the inner surface 112 to further stabilize the obstructing member within the FBR. Support elements 310, if present, may contact an inwardly facing surface of the FBR reaction chamber, thereby further stabilizing the obstructing member 300 against mechanical stresses (e.g., vibrational stresses).

Figure 3:
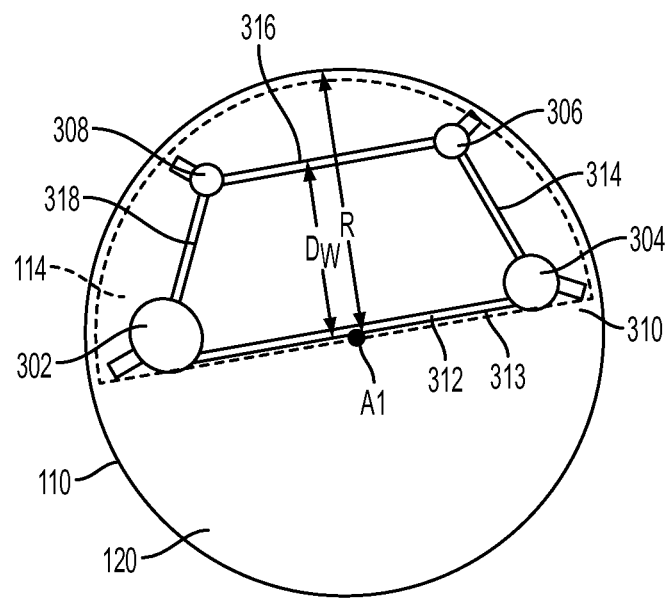
FIG. 3 is a top plan view of an exemplary obstructing member within a reaction chamber of a fluidized bed reactor.

Although the exemplary obstructing member 300 illustrated in FIGS. 2 and 3 has four receiving members and four connecting elements, a person of ordinary skill in the art will understand that the obstructing member may include more or fewer receiving members and connecting elements. For example, an obstructing member may have 3-5 receiving members and 3-5 connecting elements.

In some embodiments, one or more receiving members includes a receiving member extension (e.g., extensions 302a, 304a), which extends along a portion of an adjacent connecting element, e.g., connecting element 312. Extensions 302a, 304a may include an aperture (not shown) aligned with a corresponding aperture 320, 322 on the adjacent connecting element 312. The wall of each receiving member 302, 304 is discontinuous. An axially extending gap is provided in each wall between the extension member 302a, 304a and the facing connecting element 312, with a gap being provided between each extension member and facing connecting element. A fastener (e.g., a screw and nut, a bolt, etc.), may be inserted through each aperture 320, 322 and the aperture of the corresponding extension 302a, 304a to move the extension member 302a, 304a and connecting element 312 toward each other and secured, thereby tightening and securing the receiving member 302, 304 around an internal FBR component received within the internal passageway 303, 305 defined by the receiving member 302, 304 in the manner of a compression clamp. In an independent embodiment, the receiving member extension (e.g., extensions 302a, 304a) is welded to the corresponding connecting element, e.g., connecting element 312, thereby tightening and securing the receiving member 302, 304 around an internal FBR component received within the internal passageway 303, 305 defined by the receiving member. In this embodiment, the extensions and connecting elements might not include an aperture for receiving a fastener.

When the obstructing member 300 includes four receiving members and four connecting elements as shown in FIGS. 2 and 3, the connecting elements may be arranged as the legs of a quadrilateral. In particular, the connecting elements may serve as the bases and legs of a trapezoid in which two connecting elements (e.g., connecting elements 312, 316) are parallel to one another and form the bases of the trapezoid, and the other two connecting elements (e.g., connecting elements 314, 318) do not extend parallel to one another and form the legs of the trapezoid. One of the receiving members 302, 304, 306, 308 is located at each vertex of the trapezoid. In such embodiments, the width $D_W$ is measured as the outer distance orthogonal to the parallel bases (e.g., connecting elements 312, 316) of the trapezoid, and the length $D_L$ is longest straight-line outside measurement parallel to the trapezoid bases.

The perimeter of the obstructing member 300 defined by the receiving members and connecting elements, as viewed vertically from the top (i.e., from above the obstructing member), defines an area that is at least 15%, such as from 15-60%, of a horizontal cross-sectional area of the reaction chamber 120 as measured at the height of the obstructing member 300 within the reaction chamber 120. The horizontal area defined by the obstructing member 300 is sufficient to reduce or prevent slugging, but not so great that the obstructing member itself creates an obstruction that hinders fluidization. In some embodiments, as illustrated in FIG. 3, obstructing member 300 has a width $D_W$ that is less than or equal to the inner radius R of the reaction chamber 120 such that the obstructing member 300 can be entirely contained within a hemicylindrical region 114 of a horizontal cross-section of the reaction chamber, that is, entirely on one side of a plane that includes the centerline axis A1. Being hemicylindrical, the horizontal cross-section of the region 114 is 50% of the horizontal cross-sectional area of the reaction chamber. This configuration is in contrast to traditional bubble breakers that have a configuration (such as a grid configuration or one or more circular hoops) with a width and a length which are both greater than the reaction chamber's radius and may be substantially similar to the reaction chamber's inner diameter. Because embodiments of the disclosed obstructing member are smaller and include less material than traditional bubble breakers, the obstructing member 300 is less likely to cause product particle contamination.

In an independent embodiment (for example, as illustrated in FIG. 3), obstructing member 300 is positioned such that a connecting element, e.g., connecting element 312, has an outer surface 313 that is coincident with the vertical central axis $A_1$ of reaction chamber 120 and that extends radially from the vertical central axis $A_1$ along a plane that includes the central axis $A_1$. The connecting element 312 shears a slug rising up through a center portion of the reaction chamber. One or more of the other connecting elements also may facilitate shearing of a large slug, or may shear a smaller slug rising near outer wall 110 of the chamber 120. As the slug breaks, the lifted portion of the fluidized bed falls back down into the remainder of the fluidized bed, thereby averting damage to the internal reactor components and reaction chamber and/or ejection of at least a portion of the fluidized bed from the reactor.

In an independent embodiment, when the obstructing member 300 defines a surface area that is less than 50% of the horizontal cross-sectional area of the reaction chamber 120 (e.g., from 15-40%, 15-30%, or 15-25%), the obstructing member 300 is positioned proximate outer wall 110. For example, exemplary obstructing member 300 may be positioned such that connecting element 316 is proximate outer wall 110 and connecting element 312 does not extend through the vertical central axis $A_1$.

Figure 4:
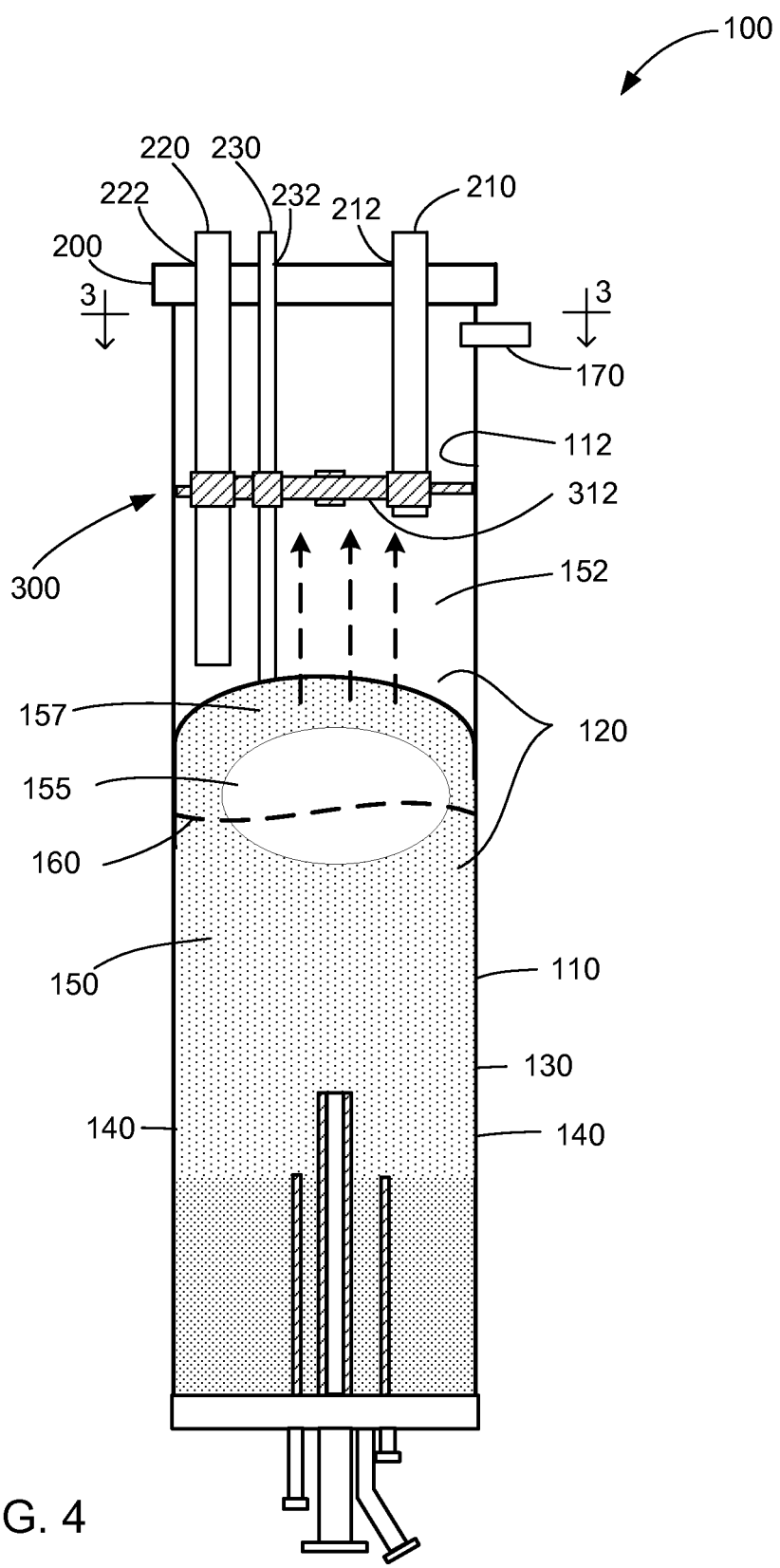
FIG. 4 is a schematic vertical cross-sectional view of an exemplary obstructing member within a fluidized bed reactor.

FIG. 4 illustrates an exemplary obstructing member 300 within a fluidized bed reactor 100. The obstructing member 300 may be positioned above the typical fluidized bed boundary 160. As a gas bubble 155 forms and lifts at least a portion of the bed 150 upward, a slug of rising fluidized particles 157 is formed that will rise into the freeboard region 152 and strike the obstructing member 300 as it continues to rise. A connecting element, e.g., connecting element 312, shears the rising slug 157 and bubble 155, causing the particles that were carried upward in the slug 157 to fall back down to the typical boundary 160. The height of the obstructing member 300 in the reaction chamber 120 is selected to provide effective bubble/slug breaking while minimizing the potential for product contamination. Thus, the height is sufficient that there is little or no contact between the fluidized bed 150 and the obstructing member 300 unless a slug 157 rises in the reaction chamber 120. Advantageously, the obstructing member is positioned 1-1.5 m above the boundary 160. A person of ordinary skill in the art understands that the internal FBR components (e.g., thermocouple, pressure tap, seed nozzle) do not have a sufficient horizontal cross-sectional area to effectively break rising slugs.

Advantageously, the obstructing member is made of a material capable of withstanding the pressure, temperature, and chemical conditions within the reactor. The material also may be a non-contaminating material, i.e., a material that does not produce undesirable contamination in the silicon-coated granular particles formed within the FBR.

For FBRs used to manufacture silicon-coated granular material, suitable materials for constructing the obstructing member include, but are not limited to, high-temperature steels, e.g., 304H or 304L stainless steel, martensitic stainless steel alloys (stainless steel alloys having a body-centered tetragonal crystal structure, less than 20% (w/w) chromium, and less than 6% (w/w) nickel), certain nickel-iron-chromium alloys, e.g., Incoloy® 800H, certain iron-chromium-nickel-molybdenum alloys, or cobalt-based superalloys (a cobalt-based alloy having a face-centered cubic crystal structure, and suitable for use at temperatures above 540° C. (1000° F.)). As used herein the term "superalloy" refers to a nickel- or cobalt-based alloy with a face-centered cubic (austenitic) crystal structure.

Stainless steel 304H comprises 0.04-0.1 wt % carbon, up to 2 wt % manganese, up to 0.045 wt % phosphorus, up to 0.03 wt % sulfur, up to 0.75 wt % silicon, 18-20 wt % chromium, 8-10.5 wt % nickel, up to 0.1 wt % nitrogen, with the balance being iron. Stainless steel 304L comprises up to 0.03 wt % carbon, up to 2 wt % manganese, up to 0.045 wt % phosphorus, up to 0.03 wt % sulfur, up to 0.75 wt % silicon, 18-20 wt % chromium, 8-12 wt % nickel, up to 0.1 wt % nitrogen, with the balance being iron.

A martensitic stainless steel alloy may comprise less than 20% (w/w) chromium, such as 11-18% (w/w) chromium, and less than 6% (w/w) nickel. In some embodiments, the martensitic stainless steel alloy comprises less than 3% (w/w)

nickel, such as less than 1% (w/w) nickel, less than 0.8% (w/w) nickel, less than 0.5% (w/w) nickel, or substantially no nickel. In certain embodiments, the martensitic stainless steel alloy does not comprise copper and/or selenium. In yet another embodiment, the martensitic stainless steel alloy comprises 16-18% (w/w) chromium. The martensitic stainless steel alloy may further comprise 0.5-1.5% (w/w) carbon, ≤1% (w/w) silicon, ≤1% (w/w) manganese, ≤0.04% (w/w), phosphorus, and ≤0.03% (w/w) sulfur.

Incoloy® 800H is a nickel-iron-chromium alloy comprising 30-35 wt % nickel/cobalt (up to 2 wt % cobalt), 19-23 wt % chromium, up to 1 wt % silicon, up to 1.5 wt % manganese, 0.05-0.1 wt % carbon, 0.15-0.6 wt % aluminum, 0.15-0.6 wt % titanium, up to 0.015 wt % sulfur, with the balance being iron.

A suitable cobalt-based superalloy comprises 5-35% Cr, ≤10% W, ≤10% Ni, ≤5% Mo, ≤3% Fe, ≤2% Si, ≤2% C, ≤1.5% Mn, ≤1% B, ≤0.05% P, ≤0.05% S, and 30.5-75% cobalt.

In some embodiments, the obstructing member is made of a non-contaminating material or is coated with a protective layer of a non-contaminating material. For example, exposed outer surfaces of the obstructing member may be coated with protective layer material.

Suitable non-contaminating materials for constructing and/or coating the obstructing member include certain cobalt-based and nickel-based alloys and superalloys, silicon carbide, tungsten carbide (WC), tungsten carbide/cobalt (e.g., 88% WC/12% Co, 83% WC/17% Co, or 86% WC/10% Co, 4% Cr), tungsten carbide/nickel boron, silicon nitride, and combinations thereof. In certain embodiments, the suitable protective layer is a cobalt-based alloy or superalloy, a nickel-based alloy or superalloy, or any combination thereof.

Desirably, the non-contaminating material does not release (e.g., through erosion or diffusion), under the operating conditions of the fluidized bed reactor, substantial amounts of metals that can contaminate the product particles. When producing silicon-coated particles, it is undesirable to have product contamination (e.g., at the parts per thousand level) by electron donors and/or electron acceptors, such as aluminum, arsenic, boron, or phosphorus. In some embodiments, the non-contaminating material has a sufficient hardness and/or erosion resistance under the reactor operating conditions to minimize or prevent release of aluminum, arsenic, boron, or phosphorus from the protective layer. In certain embodiments, the non-contaminating material does not comprise aluminum, arsenic, boron, or phosphorus or, alternatively, does not comprise more than a trace amount of (e.g., ≤2% or ≤1%) aluminum, arsenic, boron, or phosphorus.

In some embodiments, the non-contaminating material is a cobalt-based alloy comprising 25-35% Cr, ≤10% W, ≤10% Ni, ≤5% Mo, ≤3% Fe, ≤2% Si, ≤2% C, ≤1.5% Mn, ≤1% B, ≤0.05% P, and ≤0.05% S, with the balance (30.5-75%) being cobalt. In some embodiments, the protective layer material is a nickel-based alloy having a composition comprising 4-30% Mo, 5-25% Cr, 2-15% Co, ≤2% Fe, ≤3.5% Ti, ≤2% Al, ≤1% Mn, ≤1% Si, ≤0.5% Cu, ≤0.1% C, ≤0.1% Zr, and ≤0.01% B, with the balance (23.4-89%) being nickel.

In one embodiment, the non-contaminating material is a cobalt alloy having a composition comprising 26-33% Cr, 7-9.5% W, ≤7% Ni, ≤2.5% Fe, ≤2% Si, 1.1-1.9% C, 0.5-1.5% Mn, 0.1-1.5% Mo, ≤1% B, ≤0.03% P, and ≤0.03% S, with the balance (~60%) being cobalt (e.g., Stellite® 12 alloy, available from Kennametal Stellite, Goshen, Ind.). In another embodiment, the non-contaminating material is a cobalt superalloy having a composition comprising 26% Cr, 9% Ni, 5% Mo, 3% Fe, and 2% W, with the balance (~55%) being cobalt (e.g., Ultimet® alloy, available from Haynes International, Inc., Kokomo, Ind.).

In one embodiment, the non-contaminating material is a nickel-based superalloy having a composition comprising 20% Cr, 10% Co, 8.5% Mo, 2.1% Ti, 1.5% Al, ≤1.5% Fe, ≤0.3% Mn, ≤0.15% Si, ≤0.06% C, and ≤0.005% B, with the balance (~57%) being nickel (e.g., Haynes® 282® alloy available from Haynes International, Inc., Kokomo, Ind.). In another embodiment, the non-contaminating material is a nickel-based superalloy having a composition comprising 24-26% Mo, 7-9% Cr, 2.5% Co, ≤0.8% Mn, ≤0.8% Si, ≤0.5% Al, ≤0.5% Cu, ≤0.03% C, and ≤0.006% B, with the balance (~65%) being nickel (e.g., Haynes® 242® alloy, available from Haynes International, Inc., Kokomo, Ind.). In yet another embodiment, the non-contaminating material is a nickel-based superalloy having a composition comprising 18-21% Cr, 12-15% Co, 3.5-5% Mo, 2.75-3.25% Ti, 1.2-1.6% Al, 0.03-0.1% C, 0.02-0.08% Zr, 0.003-0.01% B, ≤2% Fe, ≤0.15% Si, ≤0.1% Cu, ≤0.1% Mn, ≤0.015% P, and ≤0.015% S, with the balance being nickel (e.g., Haynes® Waspaloy alloy, available from Haynes International, Inc., Kokomo, Ind.).

In some embodiments, the obstructing member is constructed and/or coated with the same material(s) as the components to which it is anchored, e.g., the seed nozzle, pressure tap, thermocouple, etc. Using the same material provides the obstructing member with the same thermal coefficient of expansion as the components received within the receiving members. In an independent embodiment, the obstructing member is constructed of a material having a thermal coefficient of expansion substantially similar (i.e., differing by less than 20% or, advantageously, less than 10%) to the components received within the receiving members. Accordingly, when the components and obstructing member are heated to the operating temperature of the FBR, the obstructing member remains securely anchored to the components, and thermal and mechanical stresses between the obstructing member and the components are minimized.

Operation of the illustrated system is discussed herein, as an illustrative example, in reference to the deposition of silicon by the decomposition of silane ($SiH_4$), using a process as generally described in publications such as U.S. Pat. No. 5,798,137. Hydrogen gas typically is used as a diluent in such systems. It should be understood that analogous apparatus and methods can be used for other known silicon-bearing precursor gases, such as polysilanes ($Si_nH_{2n+2}$), chlorosilanes (e.g., silicon tetrachloride, trichlorosilane, dichlorosilane), bromosilanes, iodosilanes, and combinations thereof.

Initially, a bed of particles 150 (seed particles) is placed within the reaction chamber 120 of a fluidized bed reactor of the type illustrated in FIG. 4. The contents of the chamber 120 are heated to a temperature effective for decomposition a silicon-bearing gas, e.g., silane. A fluidization gas, such as hydrogen, is injected into the fluidized bed reactor through a fluidization inlet 140. In the exemplary FBR of FIG. 4, there is a plurality of fluidization inlets 140. The silicon-bearing gas is injected into the chamber 120 through inlet 130. The injected gases together pass upwardly through the particles in the chamber, and fluidize at least a portion of the bed of particles 150 inside the reactor. Exhaust gas is vented from the chamber 120 through outlet 170.

During FBR operation, large bubbles 155 may form, creating a rising slug 157, which rises into the freeboard portion 152 of the reaction chamber 120. The rising slug 157 can eject at least a portion of the fluidized bed out of the reactor or damage one or more of the internal reactor components, e.g., components 210, 220, 230. A connecting element, e.g., connecting element 312, of obstructing member 300 shears the rising slug 157 and breaks the bubble 155, thereby causing the sheared slug to fall back down below boundary 160 and return to the fluidized bed portion 150 of the chamber 120.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A reactor for producing silicon-coated granular material by thermal decomposition of a gas containing silicon, the reactor comprising:
    a vessel defining a chamber to contain a fluidized bed of particles and a freeboard region above the fluidized bed;
    a plurality of particles within the chamber, wherein the particles are seed particles, silicon-coated seed particles, or a combination thereof;
    an inlet positioned for delivering a silicon-bearing gas into the chamber to flow upwardly through the particles;
    an inlet positioned for delivering a fluidizing gas into the chamber to flow upwardly through the particles to form a fluidized bed of particles;
    an outlet for venting exhaust gas from the chamber;
    a top head;
    one or more internal reactor components extending downwardly from the top head and into the chamber, the internal reactor components comprising a seed nozzle, a thermocouple, a pressure tap, a particle sampling line, a gas sampling line, a gas feed line, a heater, or any combination thereof; and
    an obstructing member that is positioned within the freeboard region of the chamber, that is secured to at least one of the one or more internal reactor components, and that is configured to break up a rising slug of particles in the chamber, the obstructing member comprising (a) a plurality of receiving members, each receiving member comprising a tubular wall defining a passageway dimensioned to receive an internal reactor component extending downwardly from the top head, and (b) a plurality of connecting elements connecting the receiving members, wherein the perimeter of the obstructing member defined by the connecting elements and receiving members, as viewed vertically from the top, defines an area that is from 15-60% of a horizontal cross-sectional area of the region of the chamber that contains the obstructing member, and wherein one of the plurality of connecting elements has an outer surface that is coincident with a vertical central axis of the chamber and extends radially from the vertical central axis along a plane that includes the central axis.

2. The reactor of claim 1, wherein the obstructing member comprises:
    four receiving members; and
    four connecting elements connecting the receiving members.

3. The reactor of claim 2, wherein the four connecting elements are the bases and legs of a trapezoid with one of the receiving members located at each vertex of the trapezoid.

4. The reactor of claim 1, wherein each receiving member further comprises an outwardly extending support element.

5. The reactor of claim 1, wherein one or more of the plurality of receiving members further comprises a receiving member extension, which extends along a portion of an adjacent connecting element.

6. The reactor of claim 5, wherein each receiving member extension comprises an aperture aligned with a corresponding aperture on the adjacent connecting element.

7. The reactor of claim 6, wherein the obstructing member further comprises a fastener received within each receiving member extension aperture and the corresponding aperture on the adjacent connecting element.

8. The reactor of claim 1, wherein the obstructing member is constructed of high-temperature stainless steel, a martensitic stainless steel, a nickel-iron-chromium alloy, an iron-chromium-nickel-molybdenum alloy, or a cobalt-based superalloy, or a combination thereof.

9. The reactor of claim 1, wherein the obstructing member is constructed of a non-contaminating material or exposed outer surfaces of the obstructing member are coated with a protective layer of a non-contaminating material.

10. The reactor of claim 9, wherein the non-contaminating material comprises a cobalt-chromium alloy, tungsten carbide/cobalt, tungsten carbide/nickel boron, silicon carbide, or silicon nitride.

11. The reactor of claim 1, wherein the one or more internal reactor components comprise a seed nozzle, and the obstructing member is secured to the seed nozzle.

12. An obstructing member for use in a fluidized bed reactor, the obstructing member comprising:
    a plurality of receiving members, each receiving member comprising a tubular wall defining a passageway dimensioned to receive an internal reactor component located in a freeboard region of the fluidized bed reactor, wherein one or more of the plurality of receiving members further comprises a receiving member extension, which extends along a portion of an adjacent connecting element; and
    a plurality of connecting elements connecting the receiving members, wherein the perimeter of the obstructing member defined by the connecting elements and receiving members, as viewed vertically from the top, is sized and shaped to occupy from 15-60% of a horizontal cross-sectional area of a freeboard region of a fluidized bed reactor reaction chamber.

13. The obstructing member of claim 12, comprising:
    four receiving members; and
    four connecting elements connecting the receiving members, wherein the four connecting elements are the bases and legs of a trapezoid with one of the receiving members located at each vertex of the trapezoid.

14. The obstructing member of claim 12, wherein each receiving member further comprises an outwardly extending support element.

15. The obstructing member of claim 12, wherein each receiving member extension comprises an aperture aligned with a corresponding aperture on the adjacent connecting element.

16. A method for producing silicon-coated granular material by thermal decomposition of a gas containing silicon, the method comprising:
    providing a reactor comprising a vessel defining a chamber to contain a fluidized bed of particles and a freeboard region above the fluidized bed, an inlet positioned for delivering a silicon-bearing gas into the chamber to flow upwardly through the chamber, a fluidization inlet positioned for delivering a fluidizing gas into the chamber to flow upwardly through the chamber, an outlet for venting exhaust gas from the chamber, a top head, and one or more internal reactor components extending downwardly from the top head and into the chamber, the internal reactor components comprising a seed nozzle, a thermocouple, a pressure tap, a particle sampling line, a gas sampling line, a gas feed line, a heater, or any combination thereof;

providing a plurality of particles within the chamber;

heating the particles within the chamber to an effective temperature for thermal decomposition of a silicon-bearing gas;

passing a fluidization gas upwardly through the particles in the chamber to provide a fluidized bed of particles;

passing the silicon-bearing gas upwardly through the fluidized bed of particles to deposit silicon from the silicon-bearing gas onto the particles; and providing an obstructing member that is positioned within the freeboard region of the chamber, that is secured to at least one of the one or more internal reactor components, and that is configured to break up a rising slug of particles in the chamber, the obstructing member comprising (a) a plurality of receiving members, each receiving member comprising a tubular wall defining a passageway dimensioned to receive an internal reactor component extending downwardly from the top head, and (b) a plurality of connecting elements connecting the receiving members, wherein the perimeter of the obstructing member defined by the connecting elements and receiving members, as viewed vertically from above the obstructing member, occupies from 15-60% of a horizontal cross-sectional area of the region of the chamber that contains the obstructing member, and wherein providing the obstructing member comprises securing the obstructing member to the at least one of the one or more internal reactor components such that one of the plurality of connecting elements has an outer surface that is coincident with a vertical central axis of the chamber and extends radially from the vertical central axis along a plane that includes the central axis.

17. The method of claim 16, wherein providing the obstructing member further comprises securing the obstructing member to the at least one of the one or more internal reactor components such that the obstructing member is positioned above the fluidized bed of particles during reactor operation.

18. The method of claim 16, wherein the obstructing member comprises four receiving members and four connecting elements, and wherein the four connecting elements define a trapezoid.

* * * * *